United States Patent [19]
Nishi

[11] Patent Number: 5,936,303
[45] Date of Patent: Aug. 10, 1999

[54] PLASTIC MOLDED SEMICONDUCTOR PACKAGE

[75] Inventor: Shinichi Nishi, Yokohama, Japan

[73] Assignee: Kabushiki Kaisha Gotoh Seisakusho, Yokohama, Japan

[21] Appl. No.: 08/884,505

[22] Filed: Jun. 27, 1997

[30] Foreign Application Priority Data

Jun. 28, 1996 [JP] Japan .................................. 8-188284

[51] Int. Cl.$^6$ ........................ H01L 23/495; H01L 23/52; H01L 23/10
[52] U.S. Cl. ............................ 257/675; 257/691; 257/707
[58] Field of Search ................................. 257/691, 675, 257/706, 707, 666, 670

[56] References Cited

U.S. PATENT DOCUMENTS

| | | | |
|---|---|---|---|
| 4,891,687 | 1/1990 | Mallik et al. | 257/666 |
| 5,723,899 | 3/1998 | Shin | 257/666 |
| 5,757,070 | 5/1998 | Fritz | 257/675 |

FOREIGN PATENT DOCUMENTS

63-246851  10/1988  Japan .

*Primary Examiner*—Teresa M. Arroyo
*Attorney, Agent, or Firm*—Jacobson, Price, Holman & Stern, PLLC

[57] ABSTRACT

In construction of a plastic molded semiconductor package including a semiconductor die arranged on a heat sink and provided with earth and power source terminal pads and earth and power source leads arranged on the heat sink via an insulating sheet whilst surrounding the semiconductor die, concentric earth and power source conductive galleries are arranged on the insulating sheet around the semiconductor die as an interface between the terminal pads on the semiconductor die and the leads. The earth gallery connects the earth terminal pads to the earth leads whereas the power source gallery connects the power source pads to the power source leads. Use of the interface galleries reduces mutual inductance between the leads greatly, makes the entire construction very compact and significantly lowers the production cost.

5 Claims, 7 Drawing Sheets

FIG. 9 phalt SEMICONDUCTOR

PLASTIC MOLDED SEMICONDUCTOR PACKAGE

BACKGROUND OF THE INVENTION

The present invention relates to a plastic molded semiconductor package and a method for producing the same, and more particularly relates to improvement in production of a plastic molded semiconductor package provided with a heat sink for dissipation of heat.

One typical example of a multi-layer molded plastic package of such a type is proposed in Japanese Patent Opening Sho. 63-246851 originated from a U.S. patent application Ser. No. 2144 filed on Jan. 12, 1987. The molded plastic package of this prior art includes metallic power source and earth planes super-imposed with each other. The earth plane is arranged on the power source plane and provided with a center opening for attachment of a semiconductor die directly on the power source plane. The power source and earth planes are bonded to each other by an electrically insulating sheet covered with polyimide adhesive. The top surface of the earth plane is also locally covered with another electrically insulating sheet covered with polyimide adhesive for attachment of leads. The semiconductor die is provided on its top surface with a plurality of source terminal and earth terminal pads. After attachment of the semiconductor die onto the power source plane past the center opening of the earth plane, the power source terminal pads on the semiconductor die are connected via bond wires to the power source and the earth terminal pads are connected to the earth plane.

Thanks to use of the power source and earth planes, it is no longer to connect the power source terminal pads and earth terminal pads to power source leads and earth leads. The construction of the semiconductor package can be made very compact and the mutual-inductance between the leads can be reduced significantly.

Despite such advantages, however, the multi-layer construction of this semiconductor package entails increased number of operational steps in production, thereby causing undesirable rise in production cost.

SUMMARY OF THE INVENTION

It is thus the primary object of the present invention to simplify the production process of a plastic molded semiconductor package, thereby lowering its production cost.

It is another object of the present invention to reduce the mutual-inductance between leads in the construction of a plastic molded semiconductor package.

It is the other object of the present invention to provide a plastic molded semiconductor package very compact in construction.

In accordance with the basic aspect of the present invention, the semiconductor package of the present invention is characterized by inclusion of electrically conductive power source and earth galleries die cut from a single, flat, metallic plate. The two galleries are combined in an arrangement that one surrounds the other. A center opening is formed in an inside gallery for reception of a semiconductor die which is provided on its top surface with aligned power source and earth terminal pads. An electrically insulating sheet covered with adhesive is used to bond the two galleries and electrically conductive leads to a heat sink with electric insulation. After attachment of the semiconductor die onto the heat sink past the center opening in an inside gallery, bond wires are used to connect the power source terminal pads to the power source gallery as well as the earth terminal pads to the earth gallery.

DESCRIPTION OF THE PREFERRED EMBODIMENTS

Figure 1:
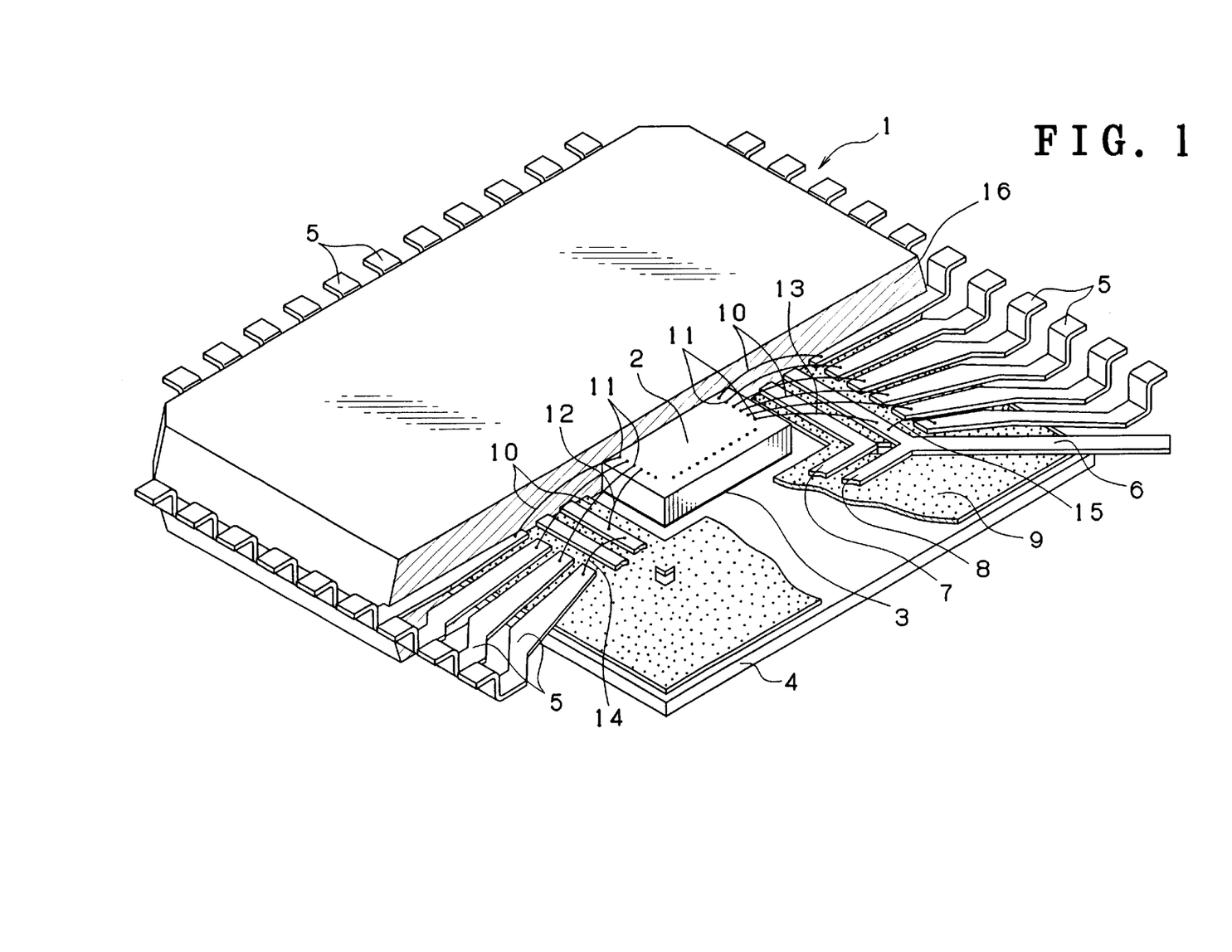
FIG. 1 is a perspective view, partly cut off, of one embodiment of the plastic molded semiconductor package in accordance with the present invention.

One embodiment of the plastic molded semiconductor package in accordance with the present invention is shown in FIG. 1, in which the semiconductor package 1 includes a semiconductor die 2 attached onto a heat sink 4 by means of proper thermally conductive adhesive 3. A plurality of leads 5 and support bars 6 are arranged around the semiconductor die 2 whilst extending outwards. In the case of the illustrated embodiment, the leads 5 are arranged along four sides of the heat sink 4. The leads 5 may be arranged along three or less sides of the heat sink 4 too. A conductive power source gallery 7 is arranged surrounding the semiconductor die 2 as the first conductive gallery and another conductive earth gallery 8 is arranged as the second conductive gallery around the power source gallery 7. The leads 5, the support bars 6, the power source gallery 7 and the earth gallery 8 are mounted onto the heat sink 4 via an electrically insulating sheet 9 covered with polyimide adhesive.

The semiconductor die 2 is provided on its top surface with a plurality of terminal pads 11. The first selected group of terminal pads 11 are connected via bond wires 10 to the inner ends of the leads 5. The second selected group of terminal pads 11 are connected via bond wires 12 to the power source gallery 7. The third selected group of terminal pads 11 are connected via bond wires 13 to the earth gallery 8. The power source gallery 7 is connected via bond wires 14 to the inner ends of the first selected group of leads 5. The earth gallery 8 is connected via bond wires 15 to the inner ends of the second selected group of leads 5. An encapsulating plastic package 16 covers the heat sink 4, the semiconductor die 2, the bond wires 10 through 15, the inner ends of the lead 5 and the support bars 6. Though not illustrated in FIG. 1, the lower surface of the heat sink 4 opposite to the semiconductor die 2 is exposed outside the encapsulating plastic package 16.

Figure 2:
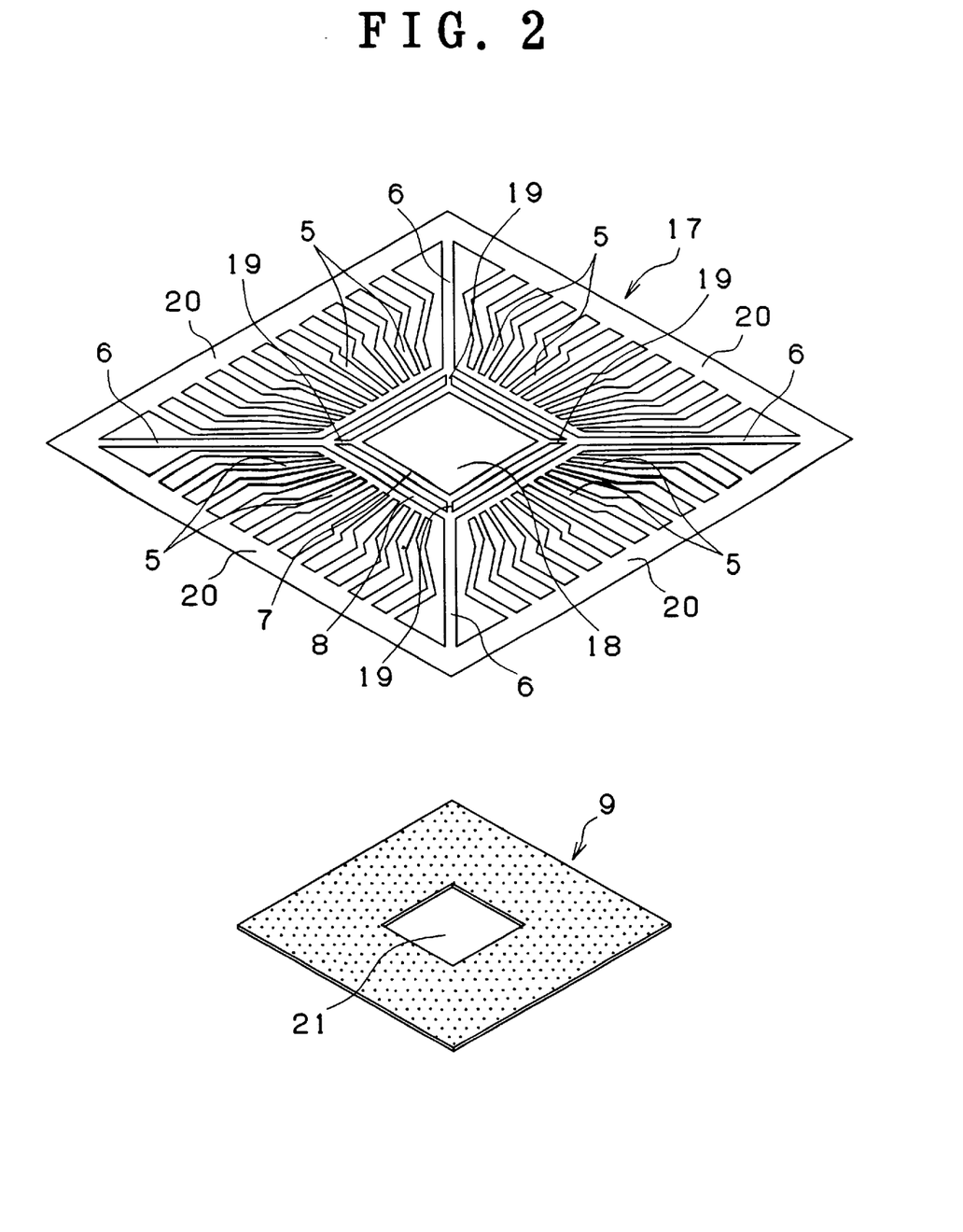
FIG. 2 is a perspective view of a lead frame and an electrically insulating sheet covered with adhesive, both being used for the semiconductor package shown in FIG. 1.

The semiconductor package 1 shown in FIG. 1 is produced generally in the following manner. The process starts from preparation of a lead frame 17 shown in FIG. 2, in which the lead frame 17 includes the leads 5, the support bars 6, the power source gallery 7 and the earth gallery 8. The power source gallery 7 is rectangular in shape and defines a center opening 18 for reception of the semiconductor die 2. The earth gallery 8 is also rectangular in shape and connected at four corners to the power source gallery 7 by connecting bars 19. The earth gallery 8 is kept in position by the support bars 6. The leads 5 and the support bars 6 are connected at their outer ends to an outer gallery 20 also rectangular in shape. The lead frame 17 is produced from various metallic plates which are generally used for production of the semiconductor package by means of die cutting or etching process. The shapes of the power source gallery 7, the earth gallery 8, the center opening 18 and the outer gallery 20 are not limited to the illustrated rectangular one and designed corresponding to the configuration of the semiconductor die to be placed in the center opening.

Figure 3:
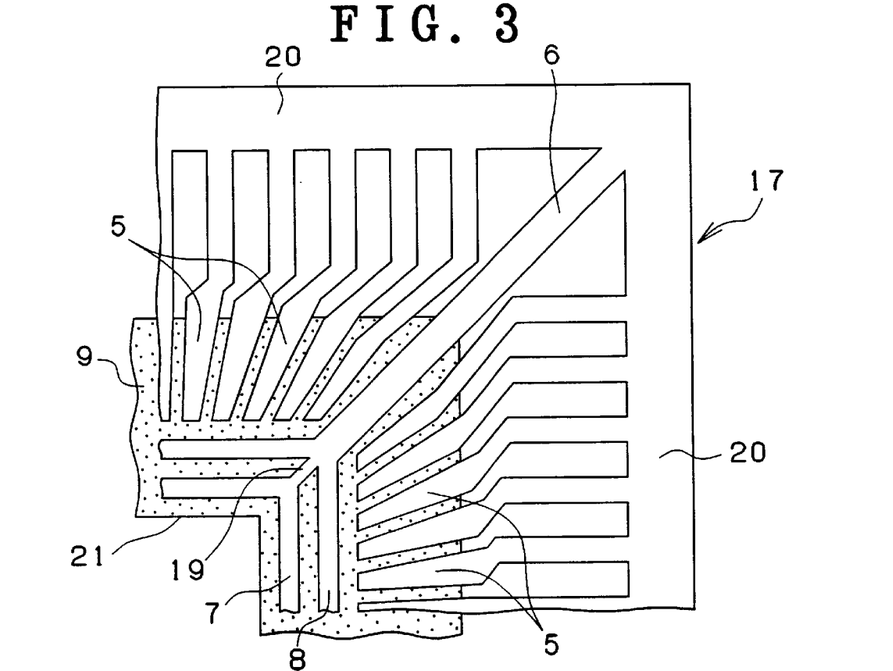
FIG. 3 is a partial plan view of the lead frame associated with the insulating sheet bonded thereto.

The insulating sheet 9 is produced by die cutting from a synthetic resin sheet covered with, for example, polyimide adhesive. The insulating sheet 9 is rectangular in shape and defines a rectangular center opening 21. The outer configuration of the insulating sheet 9 is somewhat larger than a square defined by the inner ends of the leads 5 in the lead frame 17 whilst it center opening 21 is somewhat smaller than the center opening 18 in the lead frame 17. Thus, in assembly, the insulating sheet 17 is bonded to the inner ends of the leads 5 and support bars 6, the power source gallery 7 and the earth gallery 8. The assembled state is shown in FIG. 3.

Figure 4:
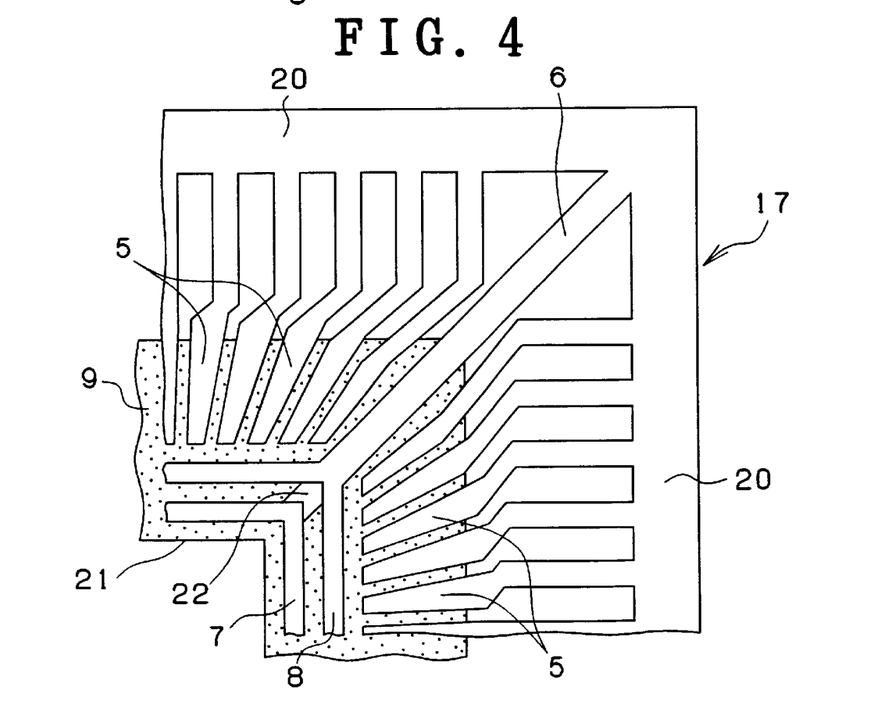
FIG. 4 is a partial plan view of the lead frame after die cutting of connecting bars.

Next as shown in FIG. 4, the connecting bars 19 are die cut with the insulating sheet 9 at four corners of the galleries 7 and 8 to form corner cutouts 22. By removal of the connecting bars 19 by such die cutting, the power source gallery 7 and the earth gallery 8 are separated from each other. At formation of the corner cutouts 22, the center opening 21 may be formed in the insulating sheet 9.

Figure 5:
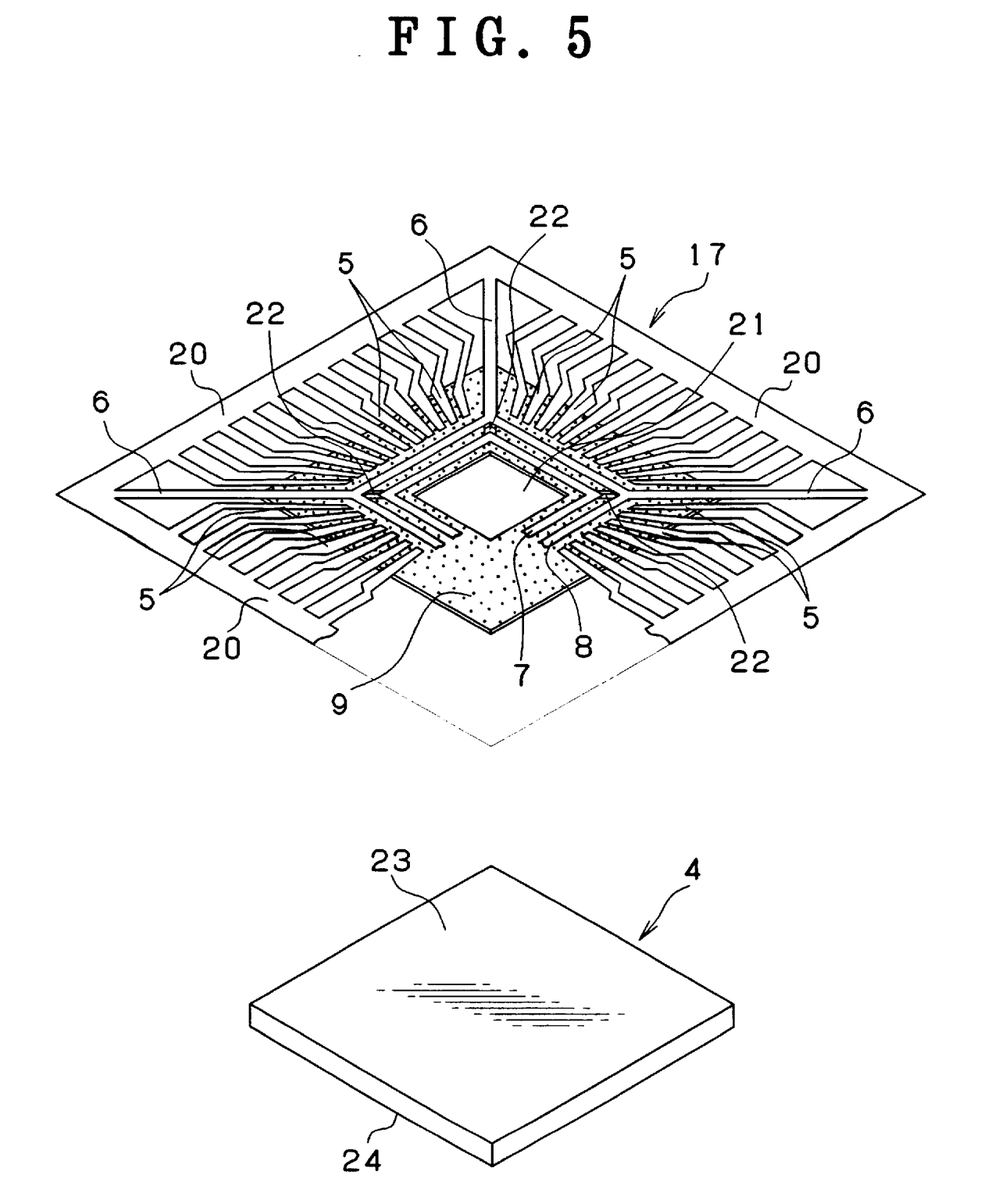
FIG. 5 is a perspective view of the lead frame associated with the insulating sheet and a heat sink to be combined therewith.
Figure 6:
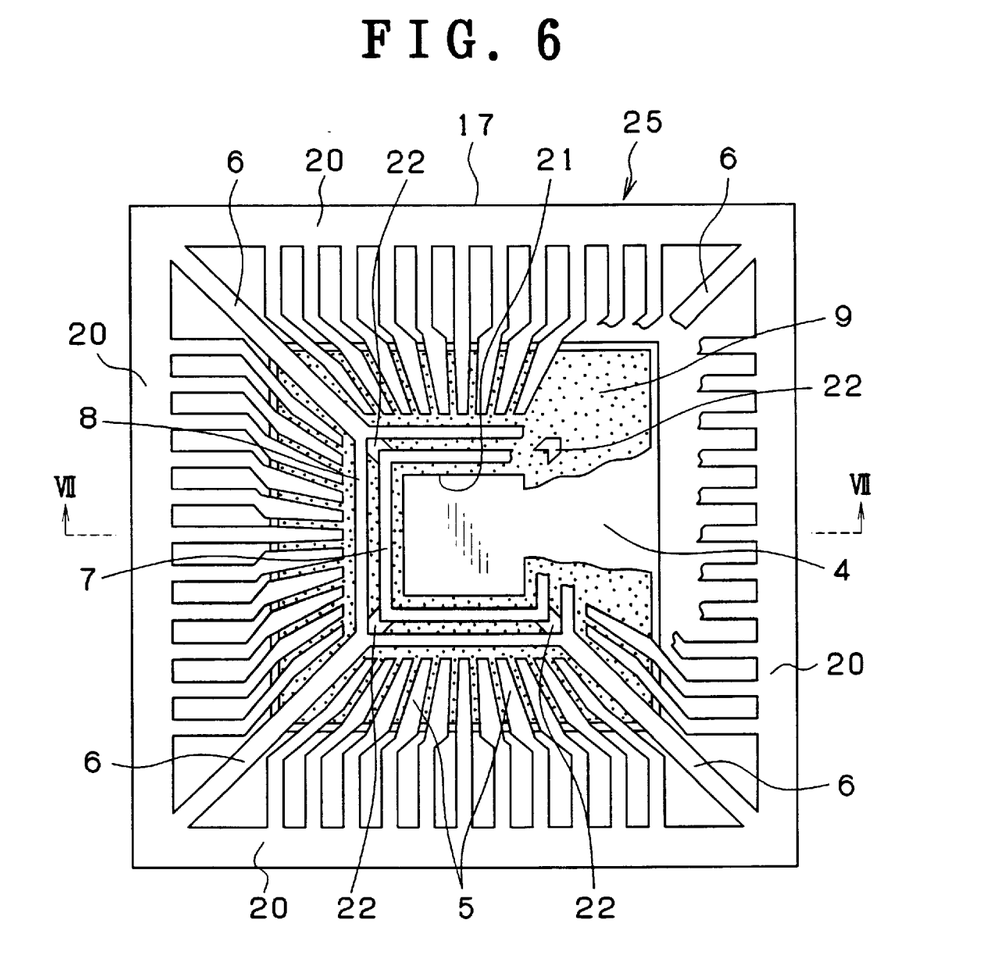
FIG. 6 is a partial plan view, partly cut off, of a lead frame assembly.
Figure 7:
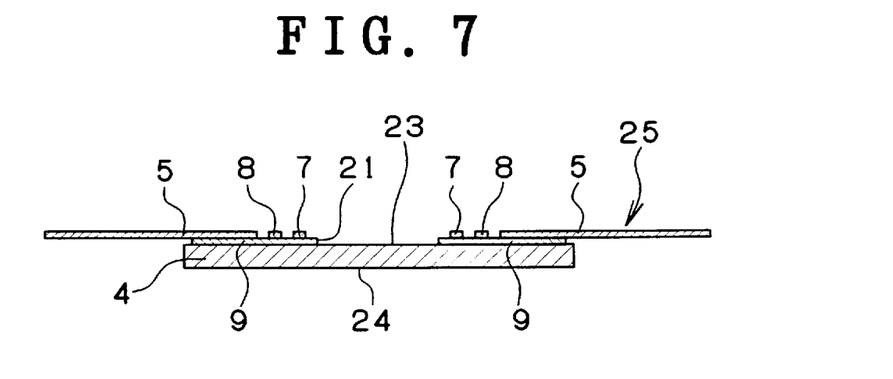
FIG. 7 shows a section taken along a line VII—VII in FIG. 6.

The lead frame 17 after attachment of the insulating sheet 9 and removal of the connecting bars 19 and the heat sink 4 are shown in FIG. 5. The heat sink 4 is produced via press shaping from a highly heat conductive metallic plate such as an aluminum plate. The heat sink 4 is rectangular in shape and its outer configuration is somewhat larger than the insulating sheet 9. The heat sink 4 is provided with first and second surfaces 23, 24 located opposite to each other. The first surface 23 of the heat sink 4 is bonded to the insulating sheet 9 to close the center opening 21 of the latter. At this phase of the production, a lead frame assembly 25 is produced as shown in FIGS. 6 and 7, in which the lead frame 17, the insulating sheet 9 and the heat sink 4 are assembled together.

Figure 8:
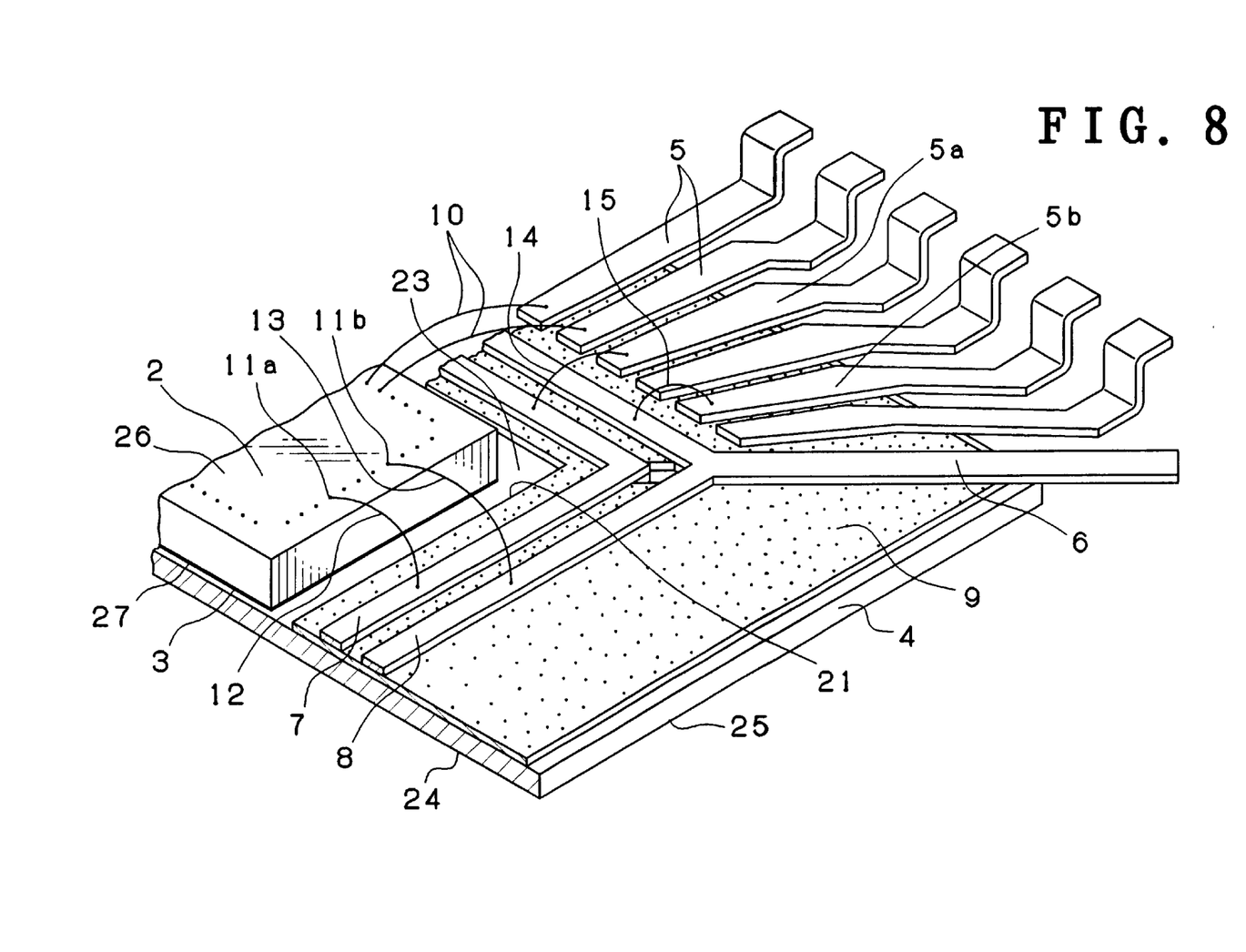
FIG. 8 is a perspective view of the lead frame assembly with the heat sink mounted thereto.

Next in FIG. 8, the semiconductor die 2 is placed on the first surface 23 of the heat sink 4 in the construction of the lead frame assembly 25. The semiconductor die 2 is provided with first and second surfaces 26, 27 located opposite to each other. The plurality of terminal pads 11 are arranged on the first (top) surface 26. The second (bottom) surface 27 of the semiconductor die 2 is bonded to the first (top) surface 23 of the heat sink 4 via the thermally conductive adhesive 3. The terminal pads 11 include power source terminal pads 11a and earth terminal pads 11b whereas the lead 5 includes power source leads 5a and earth leads 5b. The power source terminal pads 11a are connected to the power source gallery 7 via the bond wires 12. The power source gallery 7 is connected to the power source leads 5a via the bond wires 14. The earth terminal pads 11b are connected to the earth gallery 8 via the bond wires 13. The earth gallery 8 is connected to the earth leads via the bond wires 15. Remaining terminal pads 11 are connected to remaining leads 5 via the bond wires 10. The positions of the power source and earth galleries 7, 8 can be reversed.

Figure 9:
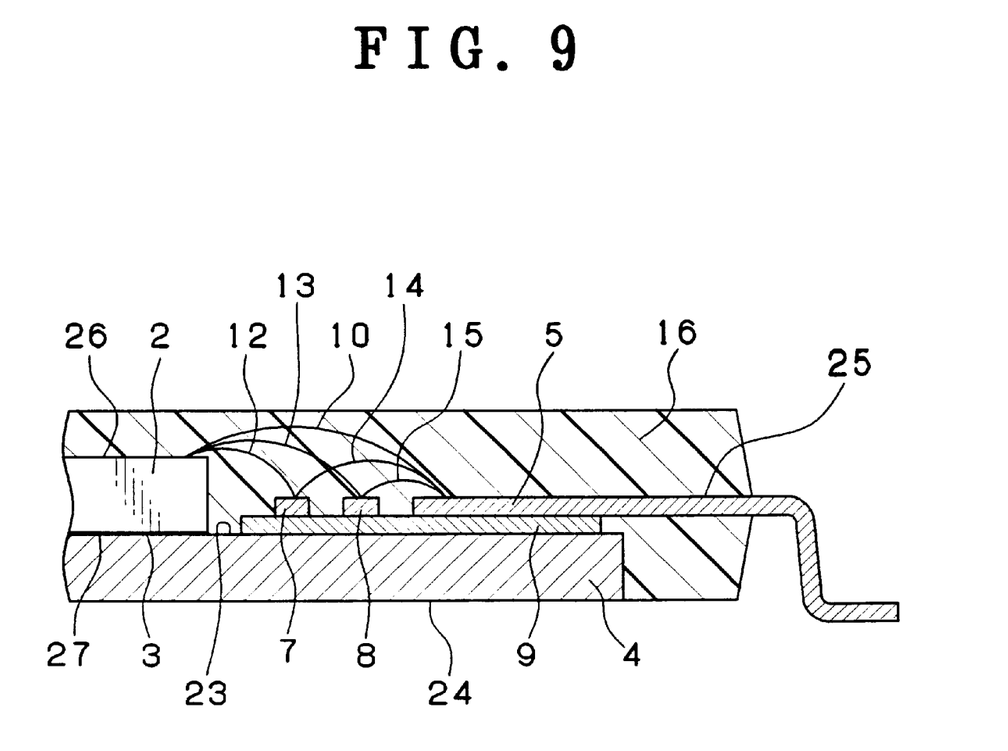
FIG. 9 is a partial sectional view of the semiconductor package in accordance with the present invention.

Next as shown in FIG. 9, the lead frame assembly 25 associated with the semiconductor die 2 is placed in position within a cavity of a mold not shown and the encapsulating plastic is filled in the cavity to encapsulate the heat sink 4, the semiconductor die 2, the inner sections of the leads 5, the power source gallery 7, the earth gallery 8, the insulating sheet 9 and the bond wires 10 through 14. The second (bottom) surface 24 of the heat sink 4, the outer sections of the leads 5 and the outer sections of the support bars 6 are exposed outside the filled plastic. After solidification of the encapsulating plastic, the outer gallery 20 of the lead frame 17 is cut for removal to separate the leads 5 and support bars 6 independently from each other. The support bars 6 are not exposed outside the plastic package 16. The outer sections of the leads 5 outside the plastic package 16 may be shaped as desired.

Thanks to use of the power source and earth galleries die cut from a single, flat metallic plate, it is no longer necessary to connect the power source and earth terminal pads on the semiconductor die to the power source and earth leads on the lead frame, respectively, thereby greatly simplifying the production process and, as a consequence, lowering the production cost. Use of these galleries results in a very compact construction of the semiconductor package and reduction in mutual-inductance between the leads. Since the two galleries are formed on a single lead frame, the semiconductor package is very thin in construction. Juxtaposed arrangement of the power source and earth galleries in a common plane greatly reduces generation of harsh noises during operation.

I claim:

1. A plastic molded semiconductor package comprising
a heat sink,
an electrically insulating sheet covering a top surface of said heat sink and defining a center opening for local exposure of said top surface of said heat sink,
a semiconductor die attached to said top surface of said heat sink past said center opening in said insulating sheet and provided with at least one exposed surface with a plurality of terminal pads,
a first electrically conductive gallery made of a unitary lead frame, attached onto said insulating sheet whilst surrounding said semiconductor die and electrically connected to a first group of terminal pads on said semiconductor die,
a second electrically conductive gallery made of said lead frame, provided with at least one support bar which extends outwards substantially in a plane of said first conductive gallery, attached onto said first conductive gallery whilst fully surrounding said first conductive gallery without any interception and electrically connected to a second group of terminal pads on said semiconductor die,
a first group of electrically conductive leads attached at inner end sections onto said insulating sheet and electrically connected at inner ends to said first conductive gallery,
a second group of electrically conductive leads attached at inner sections onto said insulating sheet and electrically connected at inner ends to said second conductive gallery,
a third group of electrically conductive leads attached at inner end sections onto said insulating sheet and electrically connected at inner ends to a third group of terminal pads on said semiconductor die, and a plastic package encapsulating said semiconductor die, said conductive galleries, said support bar and said inner sections of said leads except for outer end sections of said leads.

2. A plastic molded semiconductor package as claimed in claim 1 in which said first conductive gallery is a power source gallery, said first group of terminal pads are power source terminal pads, said first group of leads are power source leads, said second conductive gallery is an earth gallery, said second group of terminal pads are earth terminal pads, and said second group of leads are earth leads.

3. A plastic molded semiconductor package as claimed in claim 1 in which said first conductive gallery is an earth gallery, said first group of terminal pads are earth terminal pads, said first group of leads are earth leads, said second conductive gallery is a power source gallery, said second group of terminal pads are power source terminal pads, and said second group of leads are power source leads.

4. A plastic molded semiconductor package comprising a semiconductor die provided with a first surface having a plurality of terminal pads arranged thereon and a second surface located opposite to said first surface, a heat sink provided with a first surface receptive of said second surface of said semiconductor die and a second surface located opposite to said first surface, an adhesive layer adapted for bonding said second surface of said semiconductor die to said first surface of said heat sink, a first electrically conductive gallery made of a unitary lead frame, attached onto said insulating sheet whilst surrounding said semiconductor die and electrically connected to a first group of terminal pads on said semiconductor die, a second electrically conductive gallery made of said lead frame, provided with at least one support bar which extends outwards substantially in a plane of said first conductive gallery, attached onto said first conductive gallery whilst fully surrounding said first conductive gallery without any interception and electrically connected to a second group of terminal pads on said semiconductor die, a first group of leads attached at inner end sections onto said first surface of said heat sink and electrically connected at inner ends to said first conductive gallery, a second group of leads attached at inner end sections onto said first surface of said heat sink and electrically connected at inner ends to said second conductive gallery, a remaining group of leads attached at inner end sections to said first surface of said heat sink and electrically connected at inner ends to a remaining group of terminal pads on said semiconductor die, an electrically insulating sheet adapted for attachment of said conductive galleries and inner end sections of said leads onto said first surface of said heat sink, and a plastic package encapsulating said semiconductor die, said adhesive layer, said conductive galleries, said support bars and said inner end sections of said leads except for outer end sections of said leads.

5. A plastic molded semiconductor package comprising a semiconductor die provided with a first surface having a plurality of terminal pads arranged thereon and a second surface located opposite to said first surface, a heat sink provided with a first surface receptive of said second surface of said semiconductor die and a second surface located opposite to said first surface, an adhesive layer adapted for bonding said second surface of semiconductor die to said first surface of said heat sink, a first electrically conductive gallery made of a unitary lead frame, attached onto said insulating sheet whilst surrounding said semiconductor die and electrically connected to a first group of terminal pads on said semiconductor die, a second electrically conductive gallery made of said lead frame, provided with at least one support bar which extends outwards substantially in a plane of said first conductive gallery, attached onto said first conductive gallery whilst fully surrounding said first conductive gallery without any interception and electrically connected to a second group of terminal pads on said semiconductor die, a first group of leads attached at inner ends sections onto said first surface of said heat sink and electrically connected at inner ends to said first conductive gallery, a second group of leads attached at inner end sections onto said first surface of said heat sink and electrically connected at inner ends to said second conductive gallery, a remaining group of leads attached at inner end sections onto said first surface of said heat sink and electrically connected at inner ends to a remaining group of terminal pads on said semiconductor die, an electrically insulating sheet adapted for attachment of said conductive galleries and said inner sections of said leads to said first surface of said heat sink, and a plastic package encapsulating said semiconductor die, said adhesive layer, said conductive galleries, said support bars and said inner end sections of said leads except for outer end sections of said leads.

* * * * *